United States Patent
Liao

(10) Patent No.: US 7,468,620 B2
(45) Date of Patent: Dec. 23, 2008

(54) FREQUENCY GENERATOR APPARATUS AND CONTROL CIRCUIT THEREOF

(75) Inventor: Tsuoe-Hsiang Liao, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 68 days.

(21) Appl. No.: 11/462,802

(22) Filed: Aug. 7, 2006

(65) Prior Publication Data
US 2008/0030243 A1  Feb. 7, 2008

(51) Int. Cl.
*H03B 19/00* (2006.01)
(52) U.S. Cl. .................. 327/113; 327/525; 327/526; 327/291
(58) Field of Classification Search .............. 327/113, 327/525, 526, 291–299; 365/225.7
See application file for complete search history.

(56) References Cited

U.S. PATENT DOCUMENTS

| | | | |
|---|---|---|---|
| 6,188,255 B1 * | 2/2001 | Mann | 327/113 |
| 6,720,834 B2 | 4/2004 | McCarthy et al. | |
| 7,177,368 B2 * | 2/2007 | Humphreys et al. | 375/295 |
| 2005/0286332 A1 * | 12/2005 | Uvieghara | 365/225.7 |
| 2007/0257728 A1 * | 11/2007 | Boser et al. | 327/528 |

OTHER PUBLICATIONS

Jointly authored by Deen et al., Article title "Low-power CMOS integrated circuits for radio frequency applications", IEE Proc.-Circuits Devices Syst., vol. 152, No. 5, pp. 509-522, Oct. 2005.
Jointly authored by Yim et al., Article title "Switched Resonators and Their Applications in a Dual-Band Monolithic CMOS LC-Tuned VCO", IEEE Transactions on Microwave Theory and Techniques, vol. 54, No. 1, pp. 74-81, Jan. 2006.
Jointly authored by Cheng et al., Article title "A CMOS VCO for 1V, 1GHz PLL Applications", 2004 IEEE Asia-Pacific Conference on Advanced System Integrated Circuits(AP-ASIC2004)/ pp. 150-153, Aug. 4-5, 2004.

* cited by examiner

*Primary Examiner*—Tuan Lam
*Assistant Examiner*—Diana J Cheng
(74) *Attorney, Agent, or Firm*—J.C. Patents

(57) ABSTRACT

A frequency generator apparatus and a control circuit thereof are provided. The frequency generator apparatus comprises the control circuit and a frequency generator, wherein the control circuit contains an electric fuse (efuse). The control circuit outputs an enabling signal according to the state of the efuse. The frequency generator is coupled to the control circuit, receives the enabling signal, and decides to output a frequency signal or not according to the enabling signal.

50 Claims, 9 Drawing Sheets

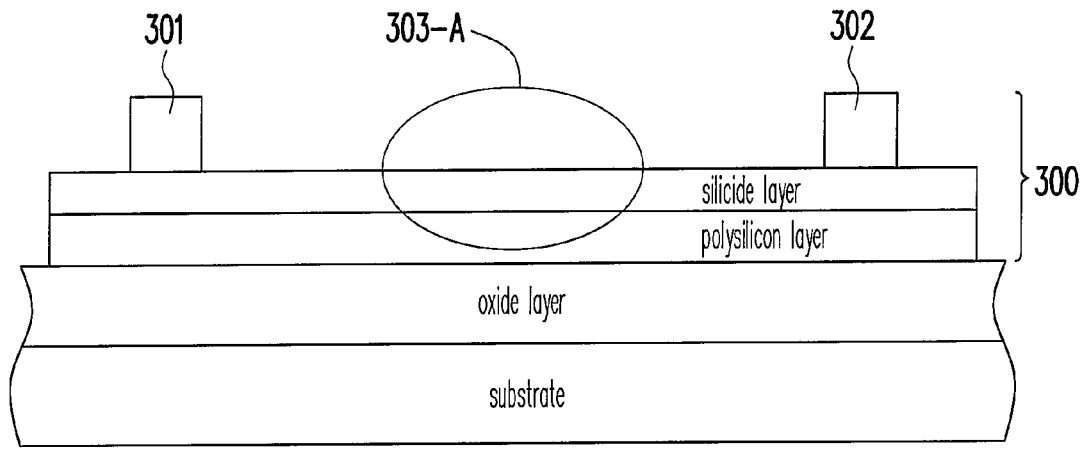
FIG. 3-A
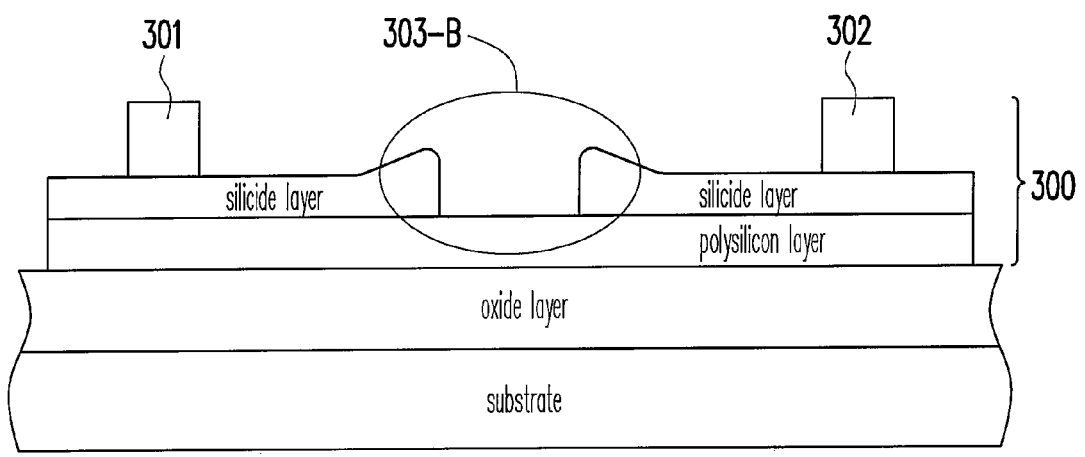
FIG. 3-B

FREQUENCY GENERATOR APPARATUS AND CONTROL CIRCUIT THEREOF

BACKGROUND OF THE INVENTION

1. Field of Invention

The present invention relates to a control circuit, and more particularly, to a frequency generator apparatus, which controls, using an electric fuse (efuse), whether or not a frequency generator is activated, and the control circuit thereof.

2. Description of Related Art

With the diversification of operation frequency for various electronic products and chips, the programmable frequency generator has been arranged in the chip or the electronic product by many manufacturers by design, so as to meet the requirements of operation frequency for various electronic products or chips developed by each client. For example, a frequency generator apparatus disclosed in U.S. Pat. publication No. 6,720,834 determines the output frequency of the voltage controlled oscillator by using a laser fuse.

FIG. 1 shows a frequency generator apparatus of U.S. Pat. publication No. 6,720,834. The conventional frequency generator apparatus is arranged in a chip. Referring to FIG. 1, control circuits 102, 103, and 104 have laser fuses 105, 106, and 107 respectively. The control circuit 102 has a diode 108, the control circuit 103 has two diodes 109 and 110, and the control circuit 104 has three diodes 111, 112, and 113. An output frequency $F_O$ generated by this conventional frequency generator apparatus is controlled by the voltage difference between two ends of the diode strings in the control circuits 102, 103, and 104, such that the number of the diodes decides the value of the output frequency $F_O$. In other words, each of the control circuits represents one option of the output frequency $F_O$. Thus, if the control circuit 102 is selected to determine the output frequency $F_O$, the laser fuse 106 in the control circuit 103 and the laser fuse 107 in the control circuit 104 must be burnt out, such that an open circuit occurs in the control circuits 103 and 104. Similarly, if the control circuit 103 is selected to determine the output frequency $F_O$, the laser fuse 105 in the control circuit 102 and the laser fuse 107 in the control circuit 104 must be burnt out respectively. If the control circuit 104 is selected to determine the output frequency $F_O$, the laser fuse 105 in the control circuit 102 and the laser fuse 106 in the control circuit 103 must be burnt out.

Since a laser beam is required to change the state of the laser fuse, an opening that is large enough for the laser beam to irradiate the fuse must be retained on the surface of the chip. Furthermore, generally, in order to prevent impurities spilled when burning out the laser fuse from staining the circuits and elements around the laser fuse, effective protective measures must be taken around the laser fuse. Further, an additional laser-supplying device is required in the chip with the conventional frequency generator apparatus, which adds additional disturbance in using the conventional frequency generator.

Compared with the laser fuse, an electric fuse (efuse) does not need a laser beam to decide its state, thus, the efuse does not occupy too much area of the chip. There are two kinds of states for the efuse, that is, program state and non-program state, which present two different resistances. The construction, the program state and non-program state of the efuse are illustrated below with reference to FIGS. 2, 3-A, and 3-B.

FIG. 2 is a top view of an electric fuse (efuse) element, FIG. 3-A is a side view of the efuse element in a non-program state, and FIG. 3-B is a side view of the efuse element in a program state. Please refer to FIGS. 2, 3-A, and 3-B according to the following illustration. 201, 202 shown in FIG. 2 indicate contacts, 203 indicates a fuse region, and 204, 205 indicate contact regions. 301 and 302 in FIGS. 3-A and 3-B indicate the contacts 201 and 202 in FIG. 2. A silicide layer, a polysilicon layer, an oxide layer, and a substrate are shown in both FIGS. 3-A and 3-B, and the numeral 300 in FIGS. 3-A and 3-B indicates the efuse element shown in FIG. 2. 303-A in FIG. 3-A and 303-B in FIG. 3-B indicate the fuse region in FIG. 2.

When the efuse element 300 is at the non-program state, the fuse region therein has not burnt out yet and thereby being at the state of 303-A in FIG. 3-A. Therefore, the contacts 301 and 302 may still be electrically conducted by the silicide layer and the polysilicon layer, such that the resistance of the efuse element 300 at this time is relatively low (generally about 5Ω). However, when the efuse element 300 is at the program state, the fuse region therein is burnt out due to a large current between the contacts 301 and 302, and thereby being at the state of 303-B in FIG. 3-B. Therefore, when the efuse element 300 is at the program state, the contacts 301 and 302 are only electrically conducted by the polysilicon layer, such that the resistance of the efuse element 300 at this time is relatively high (generally about 300Ω).

However, different from the great difference between the resistance of the laser fuse in the program state and that in the non-program state (ideally, the resistance of the laser fuse in the non-program state is considered to be 0Ω, whereas that in the program state is considered to be infinity), the resistance of the efuse in the program state and that in the non-program state are very close, such that the laser fuse cannot be directly replaced by the efuse in the conventional art. Therefore, the efuse cannot be used for providing a program function in the conventional technology for controlling an oscillator.

SUMMARY OF THE INVENTION

The object of the present invention is to provide a frequency generator apparatus and a control circuit thereof, wherein an electric fuse (efuse) is used to control whether to activate a frequency generator or not. Furthermore, since a laser fuse is not required in the frequency generator apparatus of the present invention, the area of the chip is reduced to a great extent.

Based on the above and other objects, the present invention provides a frequency generator apparatus, which comprises a control circuit and a frequency generator. The control circuit contains an electric fuse (efuse) and outputs an enabling signal according to the state of the efuse. The frequency generator is coupled to the control circuit to receive the enabling signal and decides to output a frequency signal or not according to the enabling signal.

Based on the above and other objects, the present invention provides a control circuit, suitable for controlling at least one frequency generator, which comprises an efuse and a control unit. The control unit is coupled to the efuse and outputs an enabling signal according to the state of the efuse, and thereby the frequency generator decides to output a frequency signal or not according to the enabling signal.

In the present invention, the resistances of the efuse in a program state and in a non-program state (a lower resistance and a higher resistance respectively, without the circumstance of an infinite resistance) are both detected by the control unit, and then, the control unit outputs the enabling signal with a low voltage level or the one with a high voltage level according to the state of the efuse. Therefore, the frequency generator decides to output the frequency signal or not according to the enabling signal output from the control circuit.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3-A is a side view of an efuse element in a non-program state.

FIG. 3-B is a side view of the efuse element in a program state.

DESCRIPTION OF EMBODIMENTS

Figure 4:
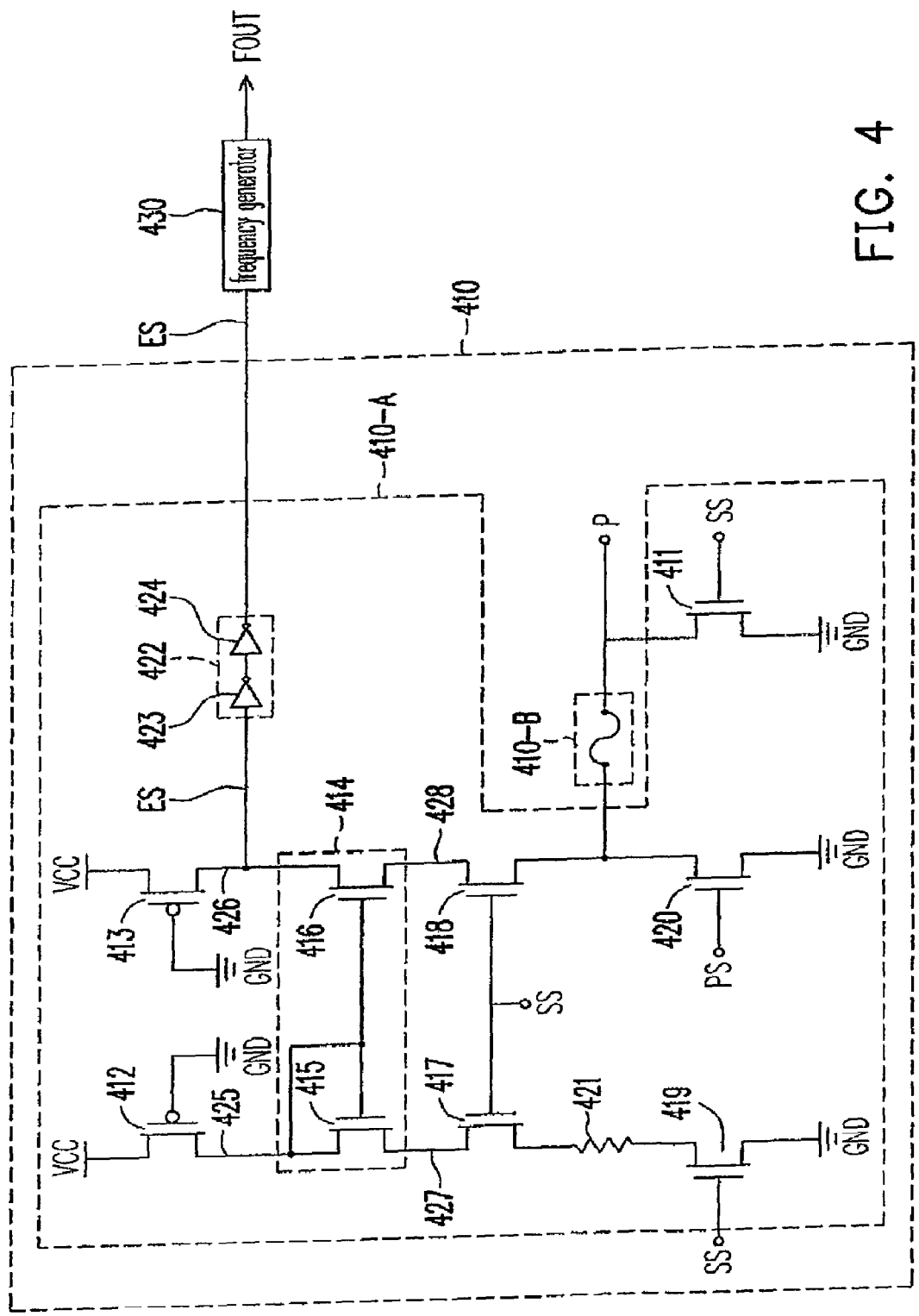
FIG. 4 shows the frequency generator apparatus according to one embodiment of the present invention.

FIG. 4 shows a frequency generator apparatus according to one embodiment of the present invention. Referring to FIG. 4, the frequency generator apparatus includes a control circuit 410 and a frequency generator 430. The frequency generator 430 is coupled to the control circuit 410. The control circuit 410 includes a control unit 410-A and an electric fuse (efuse) 410-B. The control unit 410-A is coupled to two ends of the efuse 410-B. The control unit 410-A senses the state of the efuse 410-B and outputs an enabling signal ES according to the resistance of the efuse 410-B, such that the frequency generator 430 decides to output a frequency signal FOUT or not according to the enabling signal ES.

The control unit 410-A includes a first switch 411, a first impedance 412, a second impedance 413, a current mirror device 414, a second switch 417, a third switch 418, a fourth switch 419, a fifth switch 420, a third impedance 421, and an output device 422. Each of the first switch 411, the second switch 417, the third switch 418, the fourth switch 419 and the fifth switch 420 has a first end, a second end and a control end. In this embodiment, the first switch 411, the second switch 417, the third switch 418, the fourth switch 419, and the fifth switch 420 are all implemented by NMOS, and the first impedance 412 and the second impedance 413 are both implemented by PMOS. Additionally, the third impedance 421 is implemented by a resistor. As for those skilled in the art, the impeders 412, 413, and 421 may be implemented by a resistor, a transistor, or other technologies depending on actual requirements.

The first end of the efuse is coupled to a programming node P, and the drain end of the first switch 411 is coupled to the programming node P. The first end of the efuse 410-B and the source end of the first switch 411 are coupled to a ground voltage GND. The gate end of the first switch 411 receives a first control signal SS, and the first switch 411 is decided to be turned on or not according to the first control signal SS. The source ends of the first impedance 412 and the second impedance 413 are coupled to a first voltage VCC (1.2 volts in this embodiment), and the gate ends of the first impedance 412 and the second impedance 413 are coupled to the ground voltage GND.

The current mirror device 414 has a first end 425, a second end 426, a third end 427, and a fourth end 428. The first end 425 of the current mirror device 414 is coupled to the source end of the first impedance 412, the second end 426 of the current mirror device 414 is coupled to the source end of the second impedance 413. In addition, the value of the current passing through the second end 426 of the current mirror device 414 mirrors the value of the current passing through the first end 425, and the second end 426 of the current mirror device 414 outputs the enabling signal ES. In this embodiment, the current mirror device 414 is implemented by a current mirror composed of NMOS, for example, a first MOS transistor 415 and a second MOS transistor 416 shown in FIG. 4. The drain end of the first MOS transistor 415 is the first end 425 of the current mirror device 414, the source end of the first MOS transistor 415 is the third end 427 of the current mirror device 414, and the drain end of the first MOS transistor 415 is coupled to the gate end of the first MOS transistor 415. The drain end of the second MOS transistor 416 is the second end 426 of the current mirror device 414, the source end of the second MOS transistor 416 is the fourth end 428 of the current mirror device 414, and the gate end of the second MOS transistor 416 is coupled to the gate end of the first MOS transistor 415.

The drain end of the second switch 417 is coupled to the third end 427 of the current mirror device 414 (i.e., the source end of the first MOS transistor 415), and the gate end of the second switch 417 receives the first control signal SS and decides whether to turn on the second switch 417 or not according to the first control signal SS. The drain end of the third switch 418 is coupled to the fourth end 428 of the current mirror device 414 (i.e., the source end of the second MOS transistor 416), and the gate end of the third switch 418 receives the first control signal SS and decides whether to turn on the third switch 418 or not according to the first control signal SS. One of the two ends of the third impedance 421 is coupled to the source end of the second switch 417. The drain end of the fourth switch 419 is coupled to the other end of the third impedance 421. The source end of the fourth switch 419 is coupled to the ground voltage GND. The gate end of the fourth switch 419 receives the first control signal SS and decides whether to turn on the fourth switch 419 or not according to the first control signal SS. The drain end of the fifth switch 420 is coupled to the source end of the third switch 418 and the other end of the efuse 410-B, the source end of the fifth switch 420 is coupled to the ground voltage GND, and the gate end of the fifth switch 420 receives a second control signal PS and decides whether to turn on the fifth switch 420 or not according to the second control signal PS, wherein the second control signal PS is an inverted signal of the first control signal SS.

The input end of the output device 422 is coupled to the second end 426 of the current mirror device 414 (i.e., the drain end of the second MOS transistor 416), and the output end of the output device 422 is coupled to the frequency generator 430. The output device 422 is used for receiving and enhancing the enabling signal ES. In this embodiment, the output device 422 is implemented by a first inverter 423 and a second inverter 424, wherein the input end of the first inverter 423 is the input end of the output device 422, the input end of the second inverter 424 is coupled to the output end of the first inverter 423, and the output end of the second inverter 424 is the output end of the output device 422.

When the control unit 410-A is conducting a sensing mode, the first switch 411, the second switch 417, the third switch 418, and the fourth switch 419 are turned on under the control of the first control signal SS, and the fifth switch 420 is turned off under the control of the second control signal PS. At this time, the programming node P maintains floating. If the efuse 410-B is at a non-program state at this time, the resistance of the efuse 410-B is relatively low (for example 5Ω) at the non-program state, thus, the enabling signal ES presents a low logic level under the voltage-division effect of the second impedance 413 and the efuse 410-B. If the efuse 410-B is at a program state at this time, the resistance of the efuse 410-B is relatively high (for example about 300Ω) at the program state, thus, the enabling signal ES presents a high logic level under the voltage-division effect of the second impedance 413 and the efuse 410-B. Then, the control circuit 410 transmits the enhanced enabling signal ES to the frequency generator 430 through the buffering of the output device 422.

When the control unit 410-A is conducting a program mode, the first switch 411, the second switch 417, the third switch 418, and the fourth switch 419 are turned off under the control of the first control signal SS, and the fifth switch 420 are turned on under the control of the second control signal PS. Therefore, a current path is formed from the programming node P via the efuse 410-B and the switch 420 to the ground voltage GND. When a second voltage (in this embodiment about 3.3 volts) is applied to the programming node P, a large current passes through this current path to change the state of the efuse 410-B into the program state.

Therefore, the control circuit 410 outputs the enabling signal ES with the corresponding logic level according to the state of the efuse 410-B. It is known from the above that it may be decided whether to activate the frequency generator 430 or not only by controlling the logic state of the first control signal SS and the second control signal PS in this embodiment.

It should be noted that, although a likely form of the inner circuit for the control unit 410-A has been depicted, those skilled in the art can make modifications and variations depending on actual demands, such that the application of the present invention is not limited to such a likely form. For example, the first impedance 412 and the second impedance 413 are replaced by resistors, or the first switch 411, the second switch 417, the third switch 418, the fourth switch 419, and the fifth switch 420 are changed to be implemented by the PMOS, or the current mirror device 414 is changed to be composed of PMOS, or the output device 422 is omitted in the control unit 410-A. Any of the above circumstances all fall within the spirits of the present invention. Besides the form of the embodiment shown in FIG. 4, FIG. 5 depicts another likely form of the inner circuit for the control unit.

Figure 5:
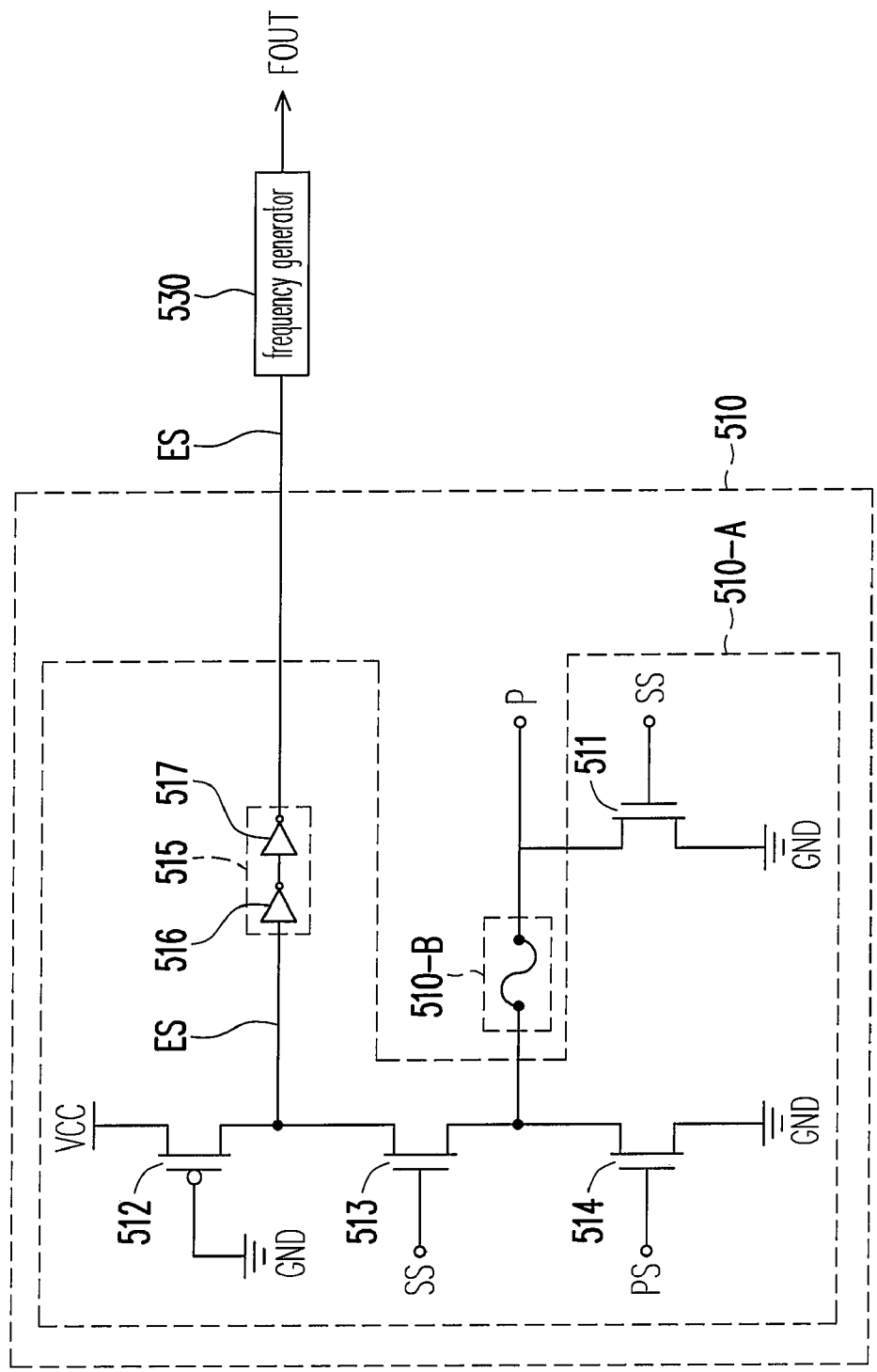
FIG. 5 shows the frequency generator apparatus according to another embodiment of the present invention.

FIG. 5 shows a frequency generator apparatus according to another embodiment of the present invention. Referring to FIG. 5, the frequency generator apparatus includes a control circuit 510 and a frequency generator 530. The control circuit 510 includes a control unit 510-A and an efuse 510-B. The control unit 510-A is coupled to two ends of the efuse 510-B, and the frequency generator 530 is coupled to the control circuit 510. The control unit 510-A outputs the enabling signal ES according to the resistance of the efuse 510-B, such that the frequency generator 530 decides whether to output the frequency signal FOUT or not according to the enabling signal ES.

The control unit 510-A includes a first switch 511, an impedance 512, a second switch 513, a third switch 514, and an output device 515. Each of the first switch 511, the second switch 513, and the third switch 514 has a first end, a second end, and a control end. In this embodiment, the first switch 511, the second switch 513, and the third switch 514 are all implemented by NMOS. The drain end of the NMOS is the first end of the first switch 511, the second switch 513, and the third switch 514. The source end of the NMOS is the second end of the first switch 511, the second switch 513, and the third switch 514. The gate end of the NMOS is the control end of the first switch 511, the second switch 513, and the third switch 514. The impedance 512 is implemented by a PMOS with the drain end and the source end of the PMOS as both ends of the impedance 512 respectively.

The drain end of the first switch 511 is coupled to the programming node P and one of the two ends of the efuse 510-B, the source end of the first switch 511 is coupled to the ground voltage GND, and the gate end of the first switch 511 receives the first control signal SS and decides whether to turn on the first switch 511 or not according to the first control signal SS. The source end of the impedance 512 is coupled to the first voltage VCC, and the gate end of the impedance 512 is coupled to the ground voltage GND. The drain end of the second switch 513 is coupled to the drain end of the impedance 512, and the gate end of the second switch 513 receives the first control signal SS and decides whether to turn on the second switch 513 or not according to the first control signal SS, wherein the drain end of the second switch 513 outputs the enabling signal ES. The drain end of the third switch 514 is coupled to the source end of the second switch 513 and the other end of the efuse 510-B, the source end of the third switch 514 is coupled to the ground voltage GND, and the gate end of the third switch 514 receives the second control signal PS and decides whether to turn on the third switch 514 or not according to the second control signal PS.

The input end of the output device 515 is coupled to the drain end of the second switch 513, the output end of the output device 515 is coupled to the frequency generator 530, and the output device 515 is used for receiving and enhancing the enabling signal ES. In this embodiment, the output device 515 is implemented by a first inverter 516 and a second inverter 517, wherein the input end of the first inverter 516 is the input end of the output device 515, the input end of the second inverter 517 is coupled to the output end of the first inverter 516, and the output end of the second inverter 517 is the output end of the output device 515.

When the control unit 510-A is conducting a sensing mode, the switches 511, 513 are turned on under the control of the first control signal SS, and the switch 514 is turned off under the control of the second control signal PS. At this time, the programming node P maintains floating. If at this time the efuse 510-B is at the non-program state, since the resistance of the efuse 510-B is relatively low (for example 5Ω) at the non-program state, the enabling signal ES presents a low logic level under the voltage-division effect of the impedance 512 and the efuse 510-B. If at this time the efuse 510-B is at the program state, since the resistance of the efuse 510-B is relatively high (for example about 300Ω) at the program state, the enabling signal ES presents a high logic level under the voltage-division effect of the impedance 512 and the efuse 510-B. Then, the control circuit 510 transmits the enhanced enabling signal ES to the frequency generator 530 through the buffering of the output device 515.

When the control unit 510-A is conducting a program mode, the switch 513 is turned off under the control of the first control signal SS, and the switch 514 is turned on under the control of the second control signal PS. Therefore, a current path is formed from the programming node P via the efuse 510-B and the switch 514 to the ground voltage GND. When a second voltage (in this embodiment about 3.3 volts) is applied to the programming node P, a large current passes through this current path to change the state of the efuse 510-B into the program state.

Therefore, the control circuit 510 may output the enabling signal ES with the corresponding logic level according to the state of the efuse 510-B. As can be known from the above that, similar to the embodiment shown in FIG. 4, it is decided whether to activate the frequency generator 530 or not only by controlling the logic state of the first control signal SS and the second control signal PS in this embodiment.

Additionally, although a likely form of the inner circuit for the control unit 510-A has been depicted in this embodiment, it is appreciated by those skilled in the art that the application of the present invention is not limited to such a likely form. For example, the impedance 512 is replaced by a resistor, or the first switch 511, the second switch 513, and the third switch 514 are changed to be implemented by the PMOS, or the output device 515 is omitted in the control unit 510-A. Any of the above circumstances all fall within the spirits of the present invention.

Figure 6:
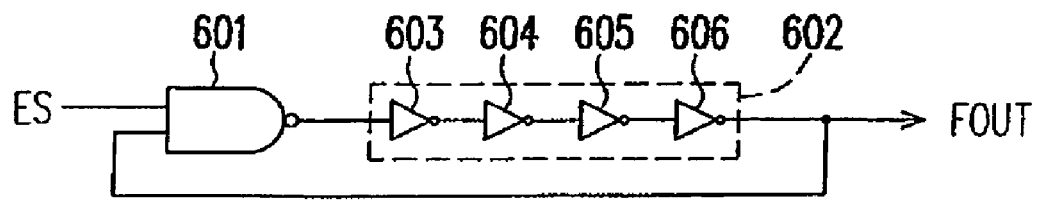
FIG. 6 is a circuit diagram of the frequency generator used in one embodiment of the present invention.

In the embodiments shown in FIGS. 4 and 5, the frequency generators 430, 530 are ordinary oscillators, or the frequency generator shown in FIG. 6. FIG. 6 is a circuit diagram of a frequency generator used in one embodiment of the present invention. Referring to FIG. 6, the circuit of the frequency generator includes an NAND gate 601 and an inverter cascade circuit 602. One of the two input ends of the NAND gate 601 receives the enabling signal ES, and the output end of the NAND gate 601 is coupled to the input end of the inverter cascade circuit 602. The output end of the inverter cascade circuit 602 outputs the frequency signal FOUT, and is also coupled to the other input end of the NAND gate 601 to feed back the frequency signal FOUT to the NAND gate 601.

The inverter cascade circuit 602 includes inverters 603, 604, 605, and 606. The input end of the inverter 603 is the input end of the inverter cascade circuit 602. The output end of the inverter 603 is coupled to the input end of the inverter 604. The output end of the inverter 604 is coupled to the input end of the inverter 605. The output end of the inverter 605 is coupled to the input end of the inverter 606. The output end of the inverter 606 is the output end of the inverter cascade circuit 602. Additionally, in such a frequency generator, an oscillation is generated by an a stable circuit formed by serially connecting the NAND gate 601 with the inverter cascade circuit 602, and there must be even-numbered of inverters in the serially connected inverter cascade circuit 602, for example, 2, 4, 6, or 8 . . . , thus, the circuit of this frequency generator is formed into an a stable state.

Referring to both FIGS. 4 and 6, when the frequency generator 430 is not activated, the efuse 410-B is kept at the non-program state, and at this time the enabling signal ES output from the control circuit 410 presents a low logic level. The NAND gate 601 keeps outputting a high logic level under the control of the enabling signal ES. Therefore, the frequency signal FOUT output from the inverter cascade circuit 602 keeps at the high logic level, that is, the frequency generator 430 is disabled.

When the frequency generator 430 is to be activated, with the control of the control signals PS and SS, the control circuit 410 proceeds to the program mode and thereby the state of the efuse 410-B is changed into the "program state". Then, again, under the control of the control signals PS and SS, the control circuit 410 proceeds to the sensing mode. After completing the sensing mode, the control circuit 410 determines the state of the efuse 410-B. At this time, the enabling signal ES output from the control circuit 410 presents a high logic level. The NAND gate 601 is equivalent to an inverter under the influence that the enabling signal ES keeps at the high logic level. Thus, an oscillation is generated by the a stable circuit formed by serially connecting the NAND gate 601 with the inverter cascade circuit 602, that is, the frequency generator 430 is enabled.

Figure 7:
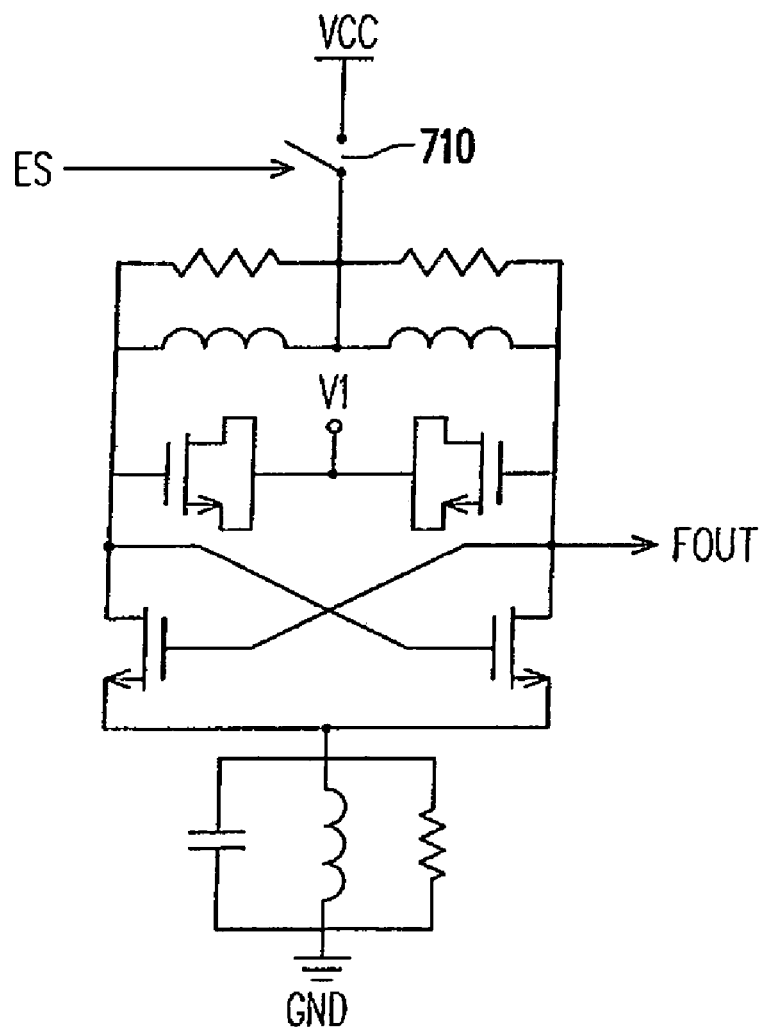
FIG. 7 shows a voltage controlled oscillator conventionally used in an RF circuit.
Figure 8:
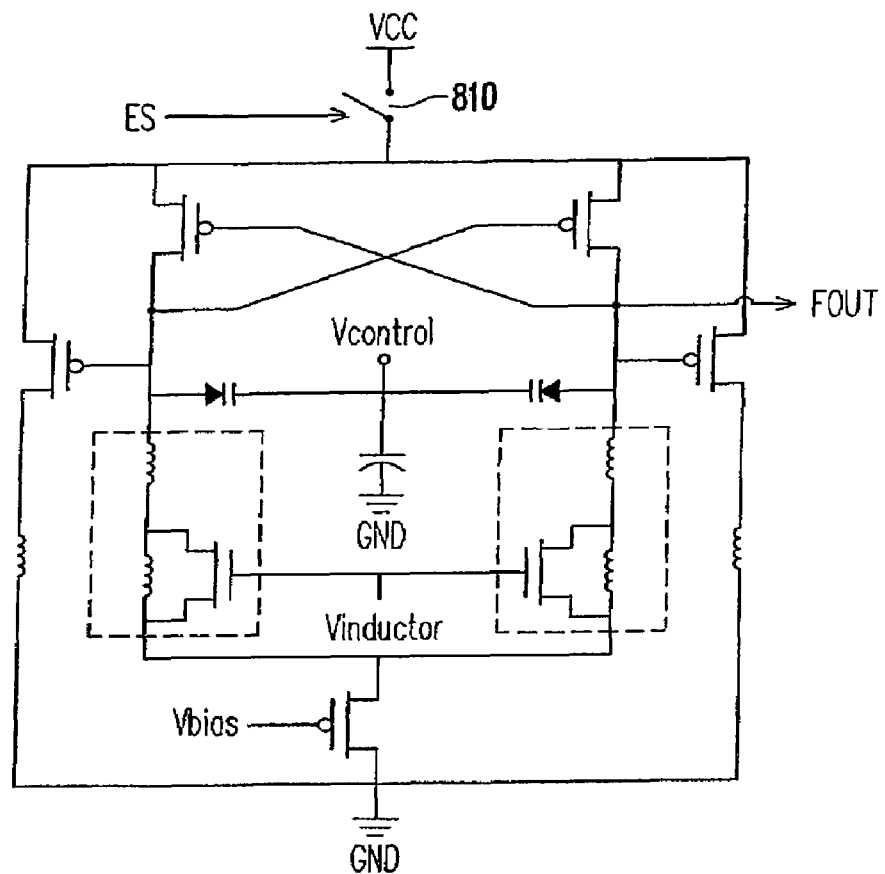
FIG. 8 shows another dual-band voltage controlled oscillator used in the RF circuit.

Besides the frequency generator shown in FIG. 6, other types of frequency generators also can be used in all the embodiments of the present invention. For example, a voltage controlled oscillator is disclosed in the paper *Low-power CMOS integrated circuits for radio frequency application in Circuits Devices Syst.*, Vol. 152, No. 5 published by the Institution of Electrical Engineers (IEE) in October, 2005, as shown in FIG. 7, or a dual-band voltage controlled oscillator is disclosed in the paper *Switched Resonators and Their Applications in a Dual-Band Monolithic CMOS LC-Tuned VCO in Microwave Theory and Techniques*, Vol. 54, No. 1 published by the Institute of Electrical and Electronic Engineers (IEEE) in January, 2006, as shown in FIG. 8. FIG. 7 shows a voltage controlled oscillator conventionally used in a radio frequency (RF) circuit. Referring to FIG. 7, the control end V1 of this conventional voltage controlled oscillator is used to adjust the frequency of the output frequency signal FOUT. The control circuit (for example, the control circuit 410 of FIG. 4) controls the switch 710 with the enabling signal ES. Thus, the frequency generator of FIG. 7 decides whether to output the frequency signal FOUT or not according to the ON/OFF state of the switch 710. Those skilled in the art may preset the above control voltage V1 at a certain fixed level. FIG. 8 shows a dual-band voltage controlled oscillator used in the RF circuit. Referring to FIG. 8, the voltages $V_{control}$, $V_{inductor}$, and $V_{bias}$ in the dual-band voltage controlled oscillator are used for adjusting the frequency of the output frequency signal FOUT. The control circuit (for example, the control circuit 410 of FIG. 4) controls the switch 810 with the enabling signal ES. Thus, the frequency generator of FIG. 8 decides whether to output the frequency signal FOUT or not according to the ON/OFF state of the switch 810. Those skilled in the art may preset the above control voltages $V_{control}$, $V_{inductor}$, and $V_{bias}$ at a certain fixed level.

Figure 9:
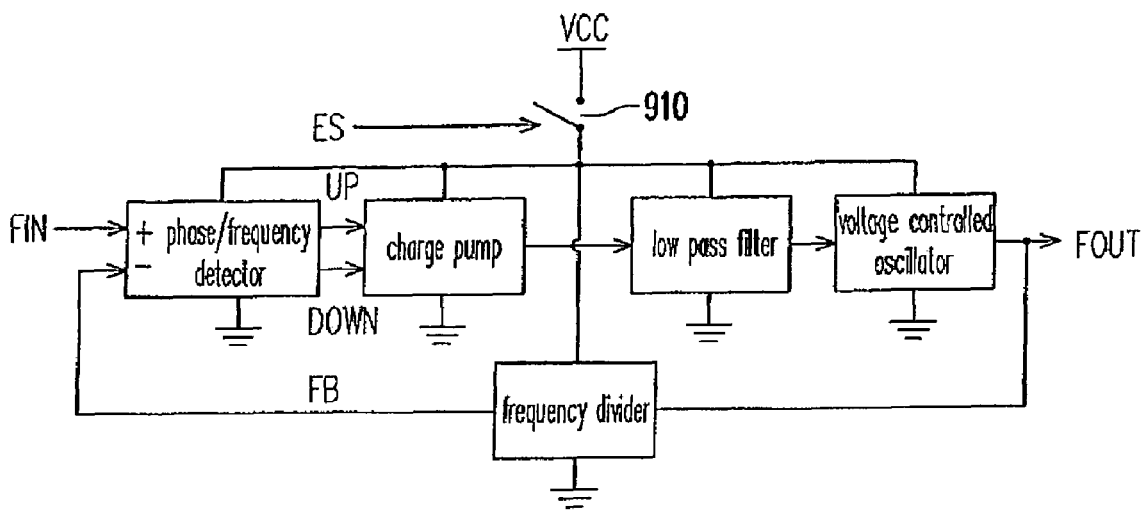
FIG. 9 is a block diagram of a conventional phase-locked loop.

Additionally, the frequency generator applied to all embodiments of the present invention also may be a phase-locked loop, for example, a phase-locked loop with the CMOS voltage controlled oscillator disclosed in the paper *A CMOS VCO for* 1V, 1 GHz *PLL Applications in Asia-Pacific Conference on Advanced System Integrated Circuit* published by IEEE in August, 2004. FIG. 9 is a block diagram illustrating the conventional phase-locked loop. Referring to FIG. 9, the conventional phase-locked loop includes a phase/frequency detector (PFD), a charge pump (CP), a low pass filter, a voltage controlled oscillator (VCO), and a frequency divider (FD). If the frequency and phase of the feedback input frequency FB output from the FD are in consistency with that of the reference input frequency FIN, it indicates that the entire phase-locked loop has already been locked. The operation process of such a conventional phase-locked loop will not be repeatedly described herein. The control circuit (for example, the control circuit 410 of FIG. 4) controls the switch 910 with the enabling signal ES. Thus, the phase-locked loop of FIG. 9 decides whether to output the frequency signal FOUT or not according to the ON/OFF state of the switch 910.

Figure 10:
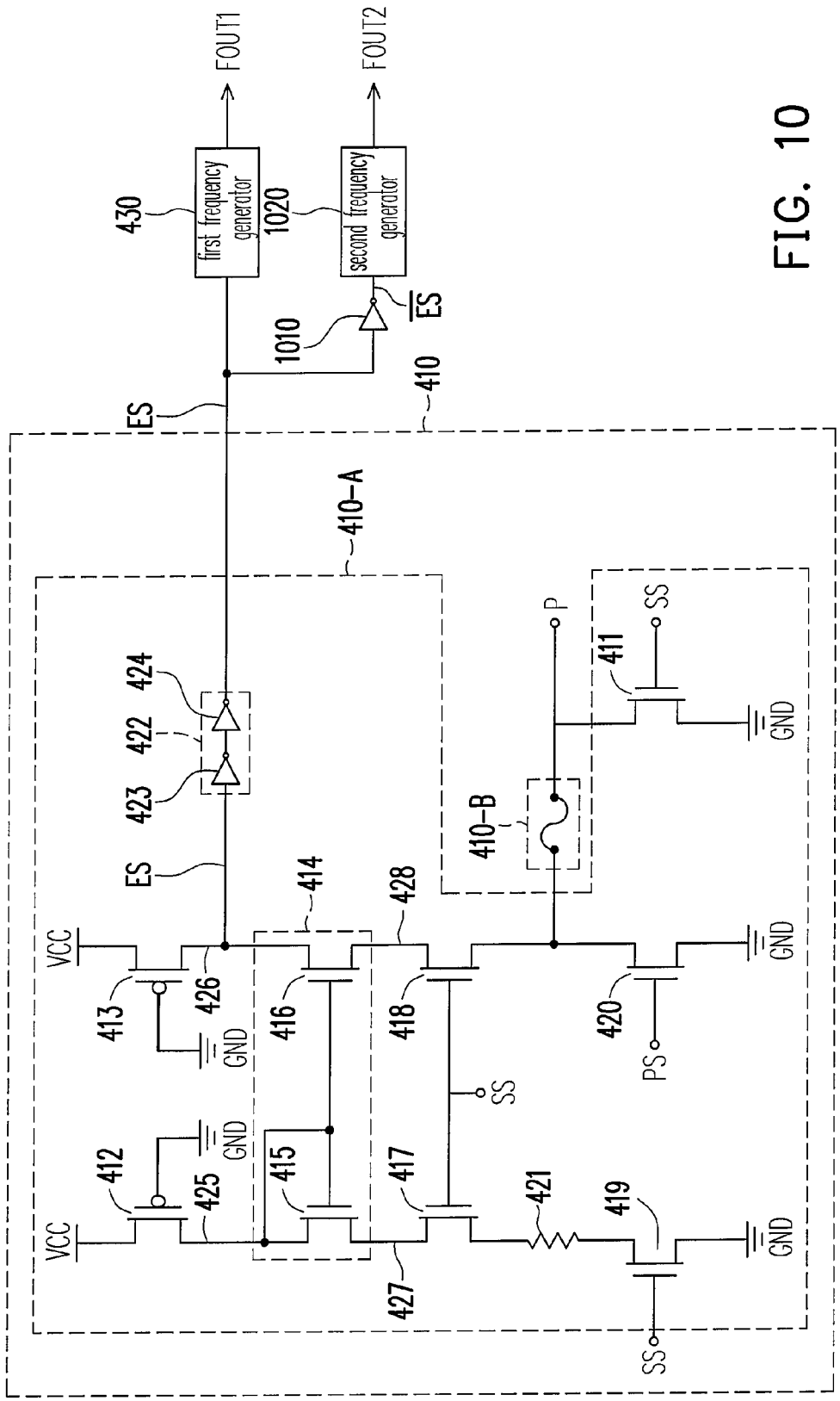
FIG. 10 shows the frequency generator apparatus with two frequency selections according to one embodiment of the present invention.

One control circuit is used together with two frequency generators with different oscillation frequencies by those skilled in the art according to the spirit of the present invention and under the illustration of the embodiments of FIGS. 4 and 5, so as to provide two frequencies to be selected by the user, as shown in FIG. 10. FIG. 10 shows a frequency generator apparatus with two kinds of frequency selections according to one embodiment of the present invention. The control circuit 410 and the first frequency generator 430 in FIG. 10 are the control circuit 410 and the first frequency generator 430 in FIG. 4, thus, the inner circuit and operation method thereof will not be repeatedly described herein any more. However, the difference between FIG. 10 and FIG. 4 lies in that an inverter 1010 and a second frequency generator 1020 are added in FIG. 10. The second frequency generator 1020 has an oscillation frequency different from that of the first frequency generator 430. The input end of the inverter 1010 is coupled to the input end of the first frequency generator 430 to receive the enabling signal ES and to invert the received enabling signal ES into an inverted signal /ES. The input end of the second frequency generator 1020 is coupled to the output end of the inverter 1010 to receive the inverted signal /ES of the enabling signal ES. Thus, the user decides to generate the frequency signal FOUT1 through the first frequency generator 430 or to generate the frequency signal FOUT2 through the second frequency generator 1020 by way of controlling the enabling signal ES to present logic 1 (high potential) or logic 0 (low potential).

Figure 11:
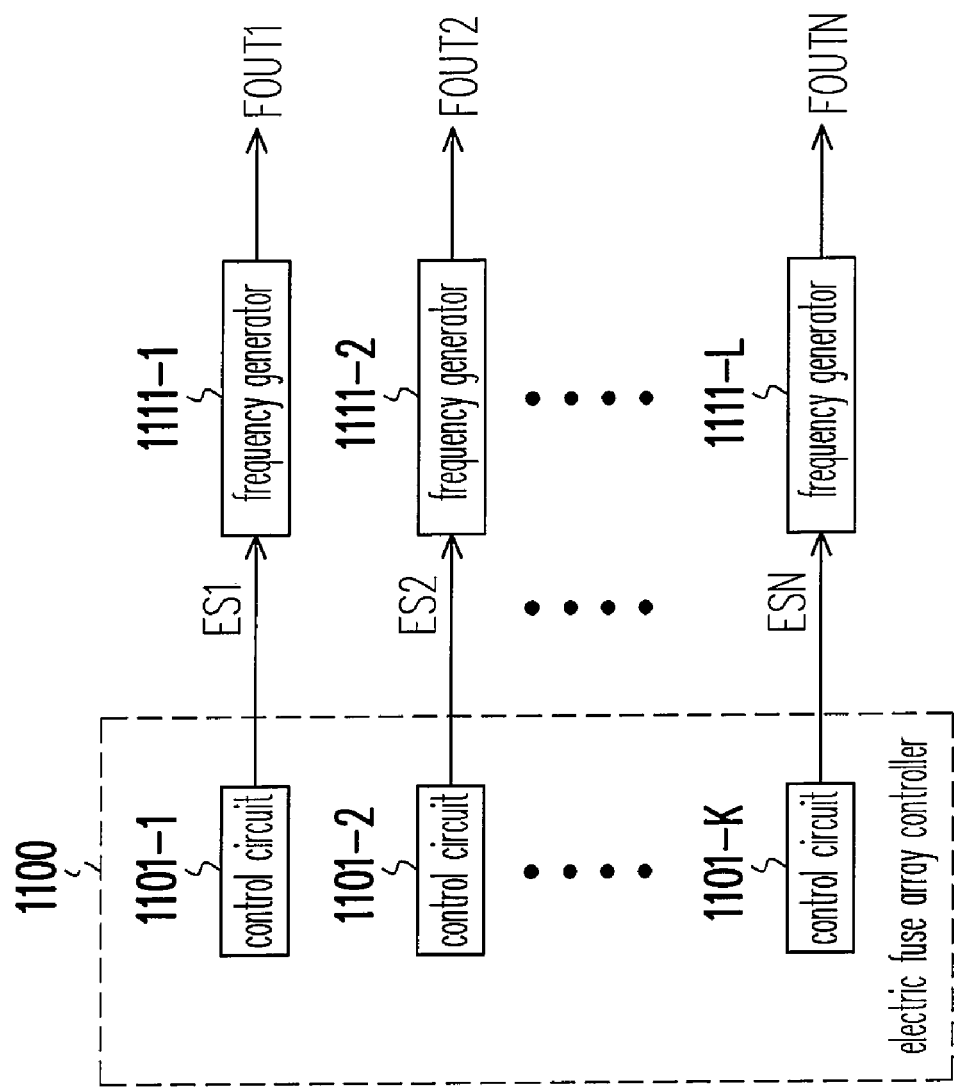
FIG. 11 shows the frequency generator apparatus with N frequency selections according to one embodiment of the present invention.

Of course, a plurality of control circuits also may be used together with a plurality of frequency generators with different frequencies according to the spirit and the teaching of the embodiment of FIG. 10, so as to form a frequency generator apparatus in an array form, as shown in FIG. 11. FIG. 11 shows a frequency generator apparatus with N frequency selections according to one embodiment of the present invention. The numeral 1100 in FIG. 11 indicates an efuse array controller. The efuse array controller 1100 is formed by N control circuits 1101-1, 1101-2, . . . , 1101-K. In this embodiment, the control circuits 1101-1, 1101-2, . . . , 1101-K are implemented with reference to the control circuit 410 of FIG. 4 or the control circuit 510 of FIG. 5, and frequency generators 1111-1, 1111-2, . . . , 1111-L are implemented with reference to the frequency generators of FIGS. 6, 7, 8, or other forms of frequency generators. Each of the frequency generators 1111-1, 1111-2, . . . , 1111-L is coupled to the corresponding control circuit to receive the enabling signals ES1-ESN output from the control circuits 1101-1, 1101-2, . . . , 1101-K respectively. Therefore, the user drives the control circuit 1101 to generate the enabling signal ES 1 depending on actual demands, such that the frequency generator 1111 is enabled by the enabling signal ES1 and then outputs the frequency signal FOUT1; or the user drives the control circuit 1102 to generate the enabling signal ES2, such that the frequency generator 1112 is enabled by the enabling signal ES2 and then outputs the frequency signal FOUT2. The operation of other frequency generators in FIG. 11 is similar to the operation of the frequency generators 1111 and 1112 and will not be repeatedly described herein any more. However, the control circuit and the frequency generator in FIG. 11 are not limited to be coupled with each other one by one; the user can also apply the method described in the embodiment of FIG. 10 to the embodiment described in FIG. 11.

Figure 1:
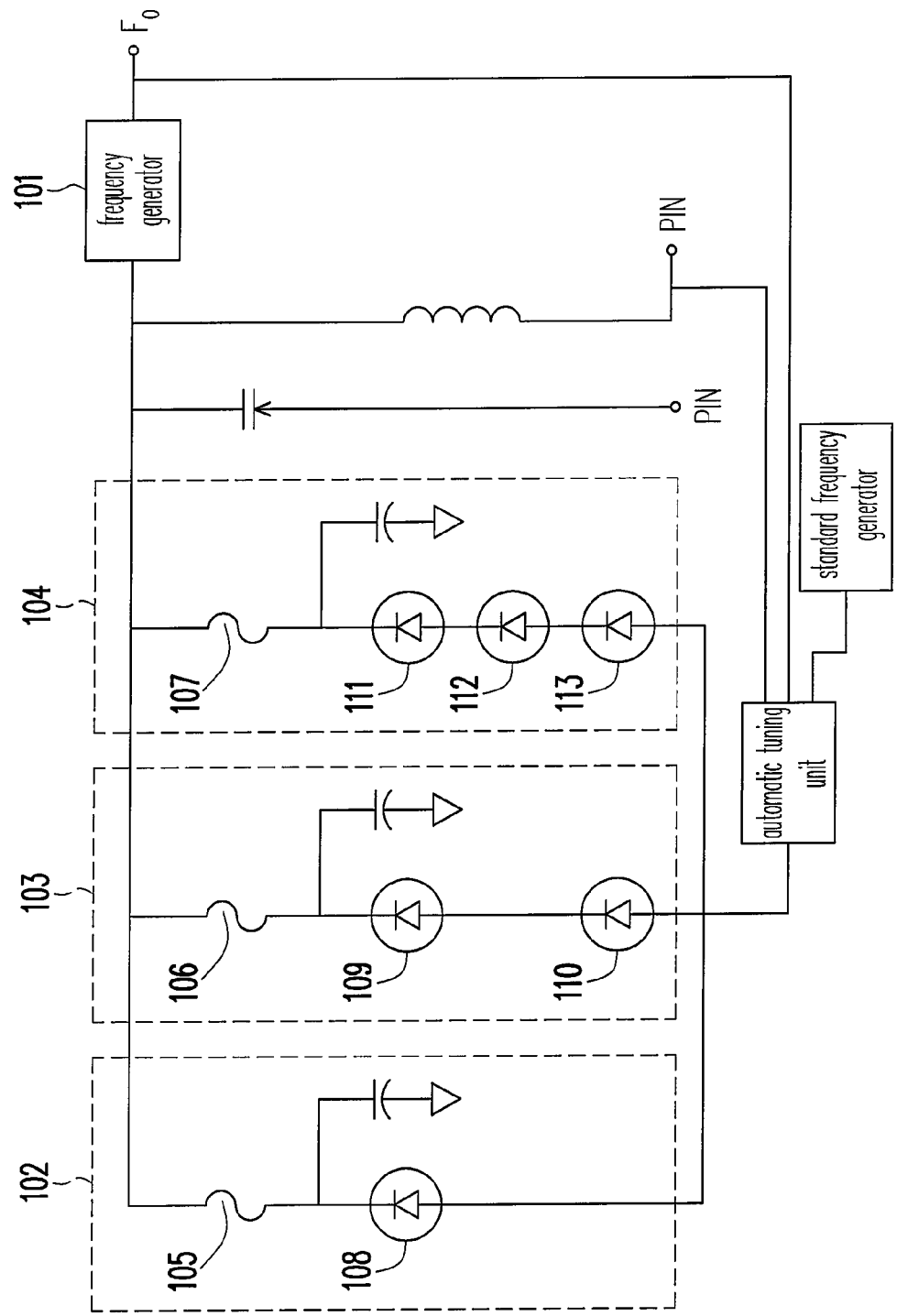
FIG. 1 shows a conventional frequency generator apparatus.
Figure 2:
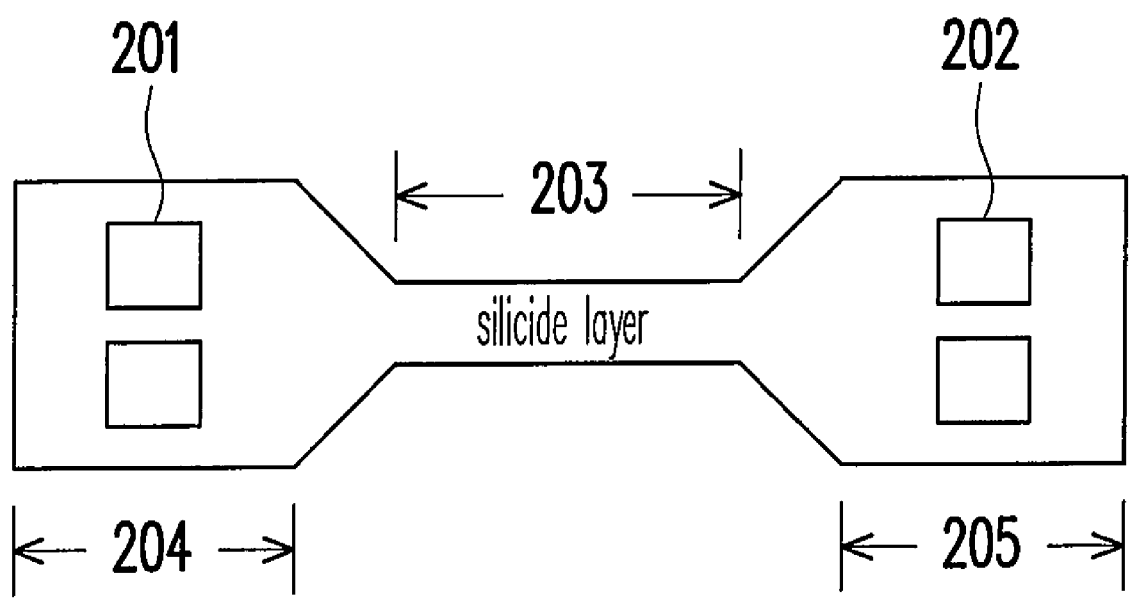
FIG. 2 is a top view of an electric fuse (efuse) element.

The conventional frequency generator apparatus shown in FIG. 1 has only one frequency generator 101, and the output frequency $F_O$ output from the frequency generator 101 is controlled by the voltage difference between two ends of the diode strings in the control circuits 102, 103, and 104, thus, the range of the frequency generated by the conventional frequency generator apparatus shown in FIG. 1 is not large. However, if the control circuit of the present invention is employed and a plurality of control circuits is used together with a plurality of frequency generators with different frequencies (for example, 1 GHz, 2 GHz, 10 MHz) to form a frequency generator apparatus in an array form, various frequency selections are provided to the user, and the range of the frequency change for the frequency generator apparatus of the present invention is much larger than that of the conventional frequency generator apparatus shown in FIG. 1.

To sum up, the control circuit is utilized in the present invention to detect the efuse that presents two resistances (a low resistance and a high resistance respectively, without the circumstance of infinite resistance) at different states respectively, and then the control circuit is used to output the enabling signal with a low voltage level or a high voltage level according to the resistances presented by the efuse. Thus, the frequency generator decides whether to output the frequency signal or not according to the enabling signal.

Therefore, the frequency generator apparatus of the present invention utilizes the efuse to control whether to activate a frequency generator or not, and only a common voltage source is required to be applied to the frequency generator apparatus of the present invention without additional laser supply equipments, such that the user can easily activate the frequency generator. In addition, another benefit of using the frequency generator apparatus of the present invention in the chip is that the volume of the chip is reduced, because the volume of the efuse is much smaller than that of the conventional laser fuse, and different from the laser fuse, a laser irradiation window is not required to be additionally disposed in the efuse. Furthermore, if a plurality of control circuits is used together with a plurality of frequency generators with different frequencies to form a frequency generator apparatus in an array form, the range of frequency change for the frequency generator apparatus of the present invention will be made relatively wide.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A frequency generator apparatus, comprising:
a control circuit, includina an electric fuse (efuse) and outputting an enabling signal according to the state of the efuse; and
a frequency generator, coupled to the control circuit to receive the enabling signal and decide whether to output a frequency signal or not according to the enabling signal, wherein the control circuit comprises:
the efuse, with a first end coupled to a programming node;
a first switch, having a first end, a second end, and a control end, with the first end coupled to the first end of the efuse, with the second end being grounded, and with the control end used for receiving a first control signal to decide whether to turn on the first switch or not according to the first control signal;
a first impedance, with a first end coupled to a first voltage;
a second impedance, with a first end coupled to the first voltage;
a current mirror device, having a first end, a second end, a third end, and a fourth end, with the first end coupled to the second end of the first impedance, with the second end coupled to the second end of the second impedance, wherein the current mirror device decides the current value of the second and fourth ends according to the current passing through the first and third ends, and the second end of the current mirror device outputs the enabling signal;

a second switch, having a first end, a second end, and a control end, with the first end coupled to the third end of the current mirror device, and with the control end used for receiving the first control signal to decide whether to turn on the second switch or not according to the first control signal;

a third switch, having a first end, a second end, and a control end, with the first end coupled to the fourth end of the current mirror device, with the second end coupled to the second end of the efuse, and with the control end used for receiving the first control signal to decide whether to turn on the third switch or not according to the first control signal;

a fourth switch, having a first end, a second end, and a control end, with the first end coupled to the second end of the second switch, with the second end being grounded, and with the control end used for receiving the first control signal to decide whether to turn on the fourth switch or not according to the first control signal; and a fifth switch, having a first end, a second end, and a control end, with the first end coupled to the second end of the third switch, with the second end being grounded, and with the control end used for receiving a second control signal to decide whether to turn on the fifth switch ot not according to the second control signal.

2. The frequency generator apparatus as claimed in claim 1, wherein the first impedance includes a PMOS transistor, with two source/drain ends of the PMOS transistor as the first and second ends of the first impedance respectively, and with a gate end of the PMOS transistor being grounded.

3. The frequency generator apparatus as claimed in claim 2, wherein the second impedance includes a PMOS transistor, with two source/drain ends of the PMOS transistor as the first and second ends of the second impedance respectively, and with a gate end of the PMOS transistor being grounded.

4. The frequency generator apparatus as claimed in claim 1, wherein each of the first and second impedances includes a resistor.

5. The frequency generator apparatus as claimed in claim 1, wherein the current mirror device includes:
a first MOS transistor, with a drain end coupled to a gate end of the first MOS transistor, wherein the drain end of the first MOS transistor is the first end of the current mirror device, and a source end of the first MOS transistor is the third end of the current mirror device; and
a second MOS transistor, with a gate end coupled to the gate end of the first MOS transistor, wherein a drain end of the second MOS transistor is the second end of the current mirror device, and a source end of the second MOS transistor is the fourth end of the current mirror device.

6. The frequency generator apparatus as claimed in claim 5, wherein each of the first and second MOS transistors includes an NMQS transistor.

7. The frequency generator apparatus as claimed in claim 1, wherein the control circuit further includes a third impedance serially connected between the second end of the second switch and the first end of the fourth switch.

8. The frequency generator apparatus as claimed in claim 7, wherein the third impedance includes a resistor.

9. The frequency generator apparatus as claimed in claim 1, wherein the control circuit further includes an output device, with an input end coupled to the second end of the current mirror device, an output end coupled to the frequency generator, and used for receiving and enhancing the enabling signal.

10. The frequency generator apparatus as claimed in claim 9, wherein the output device includes:
a first inverter, with an input end as the input end of the output device; and
a second inverter, with an input end coupled to the output end of the first inverter, and with an output end as the output end of the output device.

11. The frequency generator apparatus as claimed in claim 1, wherein the first switch is an NMOS transistor, with two source/drain ends of the NMOS transistor as the first and second ends of the first switch respectively, and with a gate end of the NMOS transistor as the control end of the first switch.

12. The frequency generator apparatus as claimed in claim 1, wherein the second switch is an NMOS transistor, with two source/drain ends of the NMOS transistor as the first and second ends of the second switch respectively, and with a gate end of the NMQS transistor as the control end of the second switch.

13. The frequency generator apparatus as claimed in claim 1, wherein the third switch is an NMOS transistor, with two source/drain ends of the NMOS transistor as the first and second ends of the third switch respectively, and with a gate end of the NMOS transistor as the control end of the third switch.

14. The frequency generator apparatus as claimed in claim 1, wherein the fourth switch is an NMOS transistor, with two source/drain ends of the NMOS transistor as the first and second ends of the fourth switch respectively, and with a gate end of the NMOS transistor as the control end of the fourth switch.

15. The frequency generator apparatus as claimed in claim 1, wherein the fifth switch is an NMOS transistor, with two source/drain ends of the NMOS transistor as the first and second ends of the fifth switch respectively, and with a gate end of the NMOS transistor as the control end of the fifth switch.

16. A frequency generator apparatus, comprising:
a control circuit, including an electric fuse (efuse) and outputting an enabling signal according to the state of the efuse; and
a frequency generator, coupled to the control circuit to receive the enabling signal and decide whether to output a frequency signal or not according to the enabling signal, wherein the control circuit includes:
the efuse, with the first end coupled to a programming node;
a first switch, having a first end, a second end, and a control end, with the first end coupled to the first end of the efuse, with the second end being grounded, and with the control end used for receiving a first control signal to decide whether to turn on the first switch or not according to the first control signal;
an impedance, with a first end coupled to a first voltage;
a second switch, having a first end, a second end, and a control end, with the first end coupled to a second end of the impedance, with the second end coupled to the second end of the efuse, and with the control end used for receiving the first control signal to decide whether to turn on the second switch or not according to the first control signal, wherein the first end of the second switch outputs the enabling signal; and a third switch, having a first end, a second end, and a control end, with the first end coupled to the second end of the second switch, with the second end being grounded, and with the control end used for receiving a second control signal to decide whether to turn on the third switch or not according to the second control signal.

17. The frequency generator apparatus as claimed in claim 16, wherein the impedance includes a PMOS transistor, with two source/drain ends of the PMOS transistor as the first and second ends of the impedance respectively, and with a gate end of the PMOS transistor being grounded.

18. The frequency generator apparatus as claimed in claim 16, wherein the impedance includes a resistor.

19. The frequency generator apparatus as claimed in claim 16, wherein the first switch is an NMOS transistor, with two source/drain ends of the NMOS transistor as the first and second ends of the first switch respectively, and with a gate end of the NMOS transistor as the control end of the first switch.

20. The frequency generator apparatus as claimed in claim 16, wherein the second switch is an NMOS transistor, with two source/drain ends of the NMOS transistor as the first and second ends of the second switch respectively, and with a gate end of the NMOS transistor as the control end of the second switch.

21. The frequency generator apparatus as claimed in claim 16, wherein the third switch is an NMQS transistor, with two source/drain ends of the NMOS transistor as the first and second ends of the third switch respectively, and with a gate end of the NMOS transistor as the control end of the third switch.

22. The frequency generator apparatus as claimed in claim 16, wherein the control circuit further includes an output device, with an input end coupled to the second end of the impedance, and with an output end coupled to the frequency generator and used for receiving and enhancing the enabling signal.

23. The frequency generator apparatus as claimed in claim 22, wherein the output device includes: a first inverter, with an input end as the input end of the output device; and a second inverter, with an input end coupled to the output end of the first inverter, and with an output end as the output end of the output device.

24. The frequency generator apparatus as claimed in claim 16, wherein the frequency generator includes an oscillator.

25. The frequency generator apparatus as claimed in claim 16, wherein the frequency generator includes: an NAND gate, with a first input end coupled to the control circuit to receive the enabling signal; and even-numbered inverters, serially connected with each other to form an inverter cascade circuit with an input end coupled to the output end of the NAND gate, with an output end coupled to the second input end of the NAND gate and being used to output the frequency signal.

26. A control circuit, suitable for controlling at least one frequency generator, comprising:
an electric fuse (efuse), with a first end coupled to a programming node; and
a control unit, coupled to the efuse to detect the state of the efuse and to output at least one enabling signal according to the detected state of the efuse, such that the frequency generator decides whether to output a frequency signal or not according to the enabling signal, wherein the control unit includes:
a first switch, having a first end, a second end, and a control end, with the first end coupled to the first end of the efuse, with the second end being grounded, and with the control end used for receiving a first control signal to decide whether to turn on the first switch or not according to the first control signal;
a first impedance, with a first end coupled to a first voltage;
a second impedance, with a first end coupled to the first voltage;
a current mirror device, having a first end, a second end, a third end, and a fourth end, with the first end coupled to the second end of the first impedance, with the second end coupled to the second end of the second impedance, wherein the current mirror device decides the current value of the second and fourth ends according to the current passing through the first and third ends, and the second end of the current mirror device outputs the enabling signal;
a second switch, having a first end, a second end, and a control end, with the first end coupled to the third end of the current mirror device, and with the control end used for receiving the first control signal to decide whether to turn on the second switch or not according to the first control signal;
a third switch, having a first end, a second end, and a control end, with the first end coupled to the fourth end of the current mirror device, with the second end coupled to the second end of the efuse, and with the control end used for receiving the first control signal to decide whether to turn on the third switch or not according to the first control signal;
a fourth switch, having a first end, a second end, and a control end, with the first end coupled to the second end of the second switch, with the second end being grounded, and with the control end used for receiving the first control signal to decide whether to turn on the fourth switch or not according to the first control signal; and
a fifth switch, having a first end, a second end, and a control end, with the first end coupled to the second end of the third switch, with the second end being grounded, and with the control end used for receiving a second control signal to decide whether to turn on the fifth switch or not according to the second control signal.

27. The control circuit as claimed in claim 26, wherein the first impedance includes a PMOS transistor, with two source/drain ends of the PMOS transistor as the first and second ends of the first impedance respectively, and with a gate end of the PMOS transistor being grounded.

28. The control circuit as claimed in claim 26, wherein the second impedance includes a PMOS transistor, with two source/drain ends of the PMOS transistor as the first and second ends of the second impedance respectively, and with a gate end of the PMOS transistor being grounded.

29. The control circuit as claimed in claim 26, wherein each of the first and second impedances includes a resistor respectively.

30. The control circuit as claimed in claim 26, wherein the current mirror device includes:
a first MOS transistor, with a first source/drain end coupled to a gate end of the first MOS transistor, wherein the first source/drain end of the first MOS transistor is the first end of the current mirror device, and a second source/drain end of the first MOS transistor is the third end of the current mirror device; and
a second MOS transistor, with a gate end coupled to the gate end of the first MOS transistor, wherein a first source/drain end of the second MOS transistor is the second end of the current mirror device, and a second source/drain end of the second MOS transistor is the fourth end of the current mirror device.

31. The control circuit as claimed in claim 30, wherein each of the first and second MOS transistors includes an NMOS transistor respectively.

32. The control circuit as claimed in claim 26, wherein the control unit further includes a third impedance serially connected between the second end of the second switch and the first end of the fourth switch.

33. The control circuit as claimed in claim 32, wherein the third impedance includes a resistor.

34. The control circuit as claimed in claim 26, wherein the control unit further includes an output device, with an input end coupled to the second end of the current mirror device, an output end coupled to the frequency generator, and used for receiving and enhancing the enabling signal.

35. The control circuit as claimed in claim 34, wherein the output device includes:
 a first inverter, with an input end as the input end of the output device; and
 a second inverter, with an input end coupled to the output end of the first inverter, and with an output end as the output end of the output device.

36. The control circuit as claimed in claim 26, wherein the first switch is an NMOS transistor, with two source/drain ends of the NMOS transistor as the first and second ends of the first switch respectively, with a gate end of the NMOS transistor as the control end of the first switch.

37. The control circuit as claimed in claim 26, wherein the second switch is an NMOS transistor, with two source/drain ends of the NMOS transistor as the first and second ends of the second switch respectively, and with a gate end of the NMOS transistor as the control end of the second switch.

38. The control circuit as claimed in claim 26, wherein the third switch is an NMOS transistor, with two source/drain ends of the NMQS transistor as the first and second ends of the third switch respectively, and with a gate end of the NMOS transistor as the control end of the third switch.

39. The control circuit as claimed in claim 26, wherein the fourth switch is an NMOS transistor, with two source/drain ends of the NMOS transistor as the first and second ends of the fourth switch respectively, and with a gate end of the NMOS transistor as the control end of the fourth switch.

40. The control circuit as claimed in claim 26, wherein the fifth switch is an NMOS transistor, with two source/drain ends of the NMOS transistor as the first and second ends of the fifth switch respectively, and with a gate end of the NMOS transistor as the control end of the fifth switch.

41. A control circuit, suitable for controlling at least one frequency generator, comprising:
 an electric fuse (efuse), with a first end coupled to a programming node; and
 a control unit, coupled to the efuse to detect the state of the efuse and to output at least one enabling signal according to the detected state of the efuse, such that the frequency generator decides whether to output a frequency signal or not according to the enabling signal, wherein the control unit includes:
  a first switch, having a first end, a second end, and a control end, with the first end coupled to the first end of the efuse, with the second end being grounded, and with the control end used for receiving a first control signal to decide whether to turn on the first switch or not according to the first control signal;
  an impedance, with a first end coupled to a first voltage;
  a second switch, having a first end, a second end, and a control end, with the first end coupled to the second end of the impedance, with the second end coupled to the second end of the efuse, and with the control end used for receiving the first control signal to decide whether to turn on the second switch or not according to the first control signal, wherein the first end of the second switch outputs the enabling signal; and
  a third switch, having a first end, a second end, and a control end, with the first end coupled to the second end of the second switch, with the second end being grounded, and with the control end used for receiving a second control signal to decide whether to turn on the third switch or not according to the second control signal.

42. The control circuit as claimed in claim 41, wherein the impedance includes a PMOS transistor, with two source/drain ends of the PMOS transistor as the first and second ends of the impedance respectively, and with a gate end of the PMOS transistor being grounded.

43. The control circuit as claimed in claim 41, wherein the impedance includes a resistor.

44. The control circuit as claimed in claim 41, wherein the first switch is an NMOS transistor, with two source/drain ends of the NMOS transistor as the first and second ends of the first switch respectively, with a gate end of the NMOS transistor as the control end of the first switch.

45. The control circuit as claimed in claim 41, wherein the second switch is an NMOS transistor, with two source/drain ends of the NMOS transistor as the first and second ends of the second switch respectively, and with a gate end of the NMOS transistor as the control end of the second switch.

46. The control circuit as claimed in claim 41, wherein the third switch is an NMOS transistor, with two source/drain ends of the NMOS transistor as the first and second ends of the third switch respectively, and with a gate end of the NMOS transistor as the control end of the third switch.

47. The control circuit as claimed in claim 41, wherein the control unit further includes an output device, with an input end coupled to the second end of the impedance, with an output end coupled to the frequency generator, and used for receiving and enhancing the enabling signal.

48. The control circuit as claimed in claim 47, wherein the output device includes: a first inverter, with an input end as the input end of the output device; and a second inverter, with an input end coupled to the output end of the first inverter, and with an output end as the output end of the output device.

49. The frequency generator apparatus as claimed in claim 1, wherein the frequency generator includes an oscillator.

50. The frequency generator apparatus as claimed in claim 1, wherein the frequency generator includes: an NAND gate, with a first input end coupled to the control circuit to receive the enabling signal; and even-numbered inverters, serially connected with each other to form an inverter cascade circuit with an input end coupled to the output end of the NAND gate, with an output end coupled to the second input end of the NAND gate and being used to output the frequency signal.

* * * * *